United States Patent
Rouh et al.

(10) Patent No.: US 8,703,564 B2
(45) Date of Patent: Apr. 22, 2014

(54) METHOD FOR MANUFACTURING A TRANSISTOR FOR PREVENTING OR REDUCING SHORT CHANNEL EFFECT

(71) Applicant: SK hynix Inc., Icheon-si (KR)

(72) Inventors: Kyoung Bong Rouh, Icheon-Si (KR); Young Hwan Joo, Cheongju (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 13/945,585

(22) Filed: Jul. 18, 2013

(65) Prior Publication Data

US 2013/0309827 A1    Nov. 21, 2013

Related U.S. Application Data

(62) Division of application No. 12/345,540, filed on Dec. 29, 2008.

(30) Foreign Application Priority Data

Nov. 12, 2008 (KR) .......................... 10-2008-0111990

(51) Int. Cl.
*H01L 29/66* (2006.01)

(52) U.S. Cl.
USPC .......................................................... 438/270

(58) Field of Classification Search
CPC .................. H01L 29/66666; H01L 27/10823; H01L 27/10876; H01L 29/66659; H01L 29/4176; H01L 29/785; H01L 29/7835
USPC ............................. 257/386, E29.255; 438/270
See application file for complete search history.

(56) References Cited

U.S. PATENT DOCUMENTS

| | | | |
|---|---|---|---|
| 3,508,962 A | 4/1970 | Simpson et al. | |
| 5,591,652 A | 1/1997 | Matsushita | |
| 5,886,373 A | 3/1999 | Hosogi | |
| 6,157,058 A | 12/2000 | Ogura | |
| 6,717,200 B1 | 4/2004 | Schamberger et al. | |
| 7,226,820 B2 | 6/2007 | Zhang et al. | |
| 7,432,167 B2 | 10/2008 | Hsieh | |
| 7,843,016 B2 * | 11/2010 | Anderson et al. | 257/386 |
| 2005/0205897 A1 * | 9/2005 | Depetro et al. | 257/213 |

(Continued)

FOREIGN PATENT DOCUMENTS

| | | |
|---|---|---|
| JP | 2001-007324 A | 1/2001 |
| KR | 10-0636680 | 10/2006 |
| KR | 10-2007-0071111 | 7/2007 |

OTHER PUBLICATIONS

Troutman, Ronald R., "VLSI Limitations from Drain-Induced Barrier Lowering"; IEEE Journal of Solid-State Circuits, vol. SC-14, No. 2, Apr. 1979.

*Primary Examiner* — Marcos D. Pizarro
*Assistant Examiner* — Sue Tang
(74) *Attorney, Agent, or Firm* — Marshall, Gerstein & Borun LLP

(57) ABSTRACT

A transistor for preventing or reducing short channel effect includes a substrate; a gate stack disposed over the substrate; a first junction region disposed on the substrate at a first side surface of the gate stack, said first junction layer being formed of an epitaxial layer; a trench formed within the substrate at a second side surface of the gate stack; and a second junction region disposed below the trench, said second junction layer being lower than the first junction region.

8 Claims, 6 Drawing Sheets

(56) References Cited

U.S. PATENT DOCUMENTS

| | | |
|---|---|---|
| 2006/0024896 A1 | 2/2006 | Huang et al. |
| 2006/0170057 A1 | 8/2006 | Bae |
| 2007/0004151 A1 | 1/2007 | Rouh et al. |
| 2007/0032028 A1 | 2/2007 | Zhu et al. |
| 2007/0145474 A1 | 6/2007 | Annese et al. |
| 2007/0152267 A1 | 7/2007 | Rouh et al. |
| 2008/0096353 A1* | 4/2008 | Rouh et al. ............ 438/270 |
| 2008/0251851 A1 | 10/2008 | Pan et al. |
| 2009/0020830 A1 | 1/2009 | Anderson et al. |

* cited by examiner

METHOD FOR MANUFACTURING A TRANSISTOR FOR PREVENTING OR REDUCING SHORT CHANNEL EFFECT

CROSS-REFERENCE TO RELATED APPLICATIONS

This is a division of U.S. application Ser. No. 12/345,540 filed on Dec. 12, 2008, which claims the priority benefit under USC 119 of KR 10-2008-0111990 filed Nov. 12, 2008, the entire respective disclosures of which are incorporated herein by reference.

BACKGROUND OF THE INVENTION

1. Field of the Invention

The present invention relates generally to a semiconductor device, and more particularly, to a transistor for preventing and reducing short channel effect and a method for manufacturing the same.

2. Description of Related Technology

As a design rule is rapidly reduced with an increase in integration of semiconductor devices, a channel length of a transistor has also been shortened. As the channel length of the transistor is shortened, problems caused by short channel effect degrade operation properties of the device. The short channel effect is generated as a width of a depletion region, generated between a substrate and a source, or between the substrate and a drain, is increased when a junction is formed on the substrate. When the channel length is shortened, intensity of an electric field is increased in the vicinity of a drain region. When the intensity of the electric field is increased, leakage current is generated in a capacitor unit in a cell region, and this leakage current deteriorates refresh properties of the device. Also, when the intensity of the electric field is increased, hot carriers and punch-through are generated and the operation properties and stability of the device are thus lowered.

Accordingly, to prevent or reduce a short channel effect, methods capable of ensuring an effective channel length without an increase in the design rule are desirable. In a method of ensuring an effective channel length, a recess gate in which a recess trench is formed within a substrate or a step gate in which a gate electrode is formed in a stepped form are typically employed to lengthen the channel. By employing gates with increased channel length through structural modification, it is possible to increase margins for the prevention of hot carrier generation and punch-through.

However, it is difficult to achieve a device operating at high speed because drain saturation current (IDsat) is noticeably reduced with the increase in the channel length. For example, in a peripheral region of a Dynamic Random Access Memory (DRAM) device, the leakage current is increased due to Drain Induced Barrier Lowering (DIBL) phenomenon when a drain-source voltage (Vds) is increased to increase the saturation current. The DIBL phenomenon means that a potential energy barrier is lowered by interaction of the source and the drain as the channel length is reduced. The potential energy barrier for electrons in the channel is lowered. The aforementioned problems caused by short channel effect and the DIBL phenomenon depend on the width of the depletion region and the electric field generated upon formation of a junction region using an ion implantation process. Accordingly, a method capable of controlling the width of the depletion region and the intensity of the electric field and preventing the degradation of device properties is desirable.

SUMMARY OF THE INVENTION

In one embodiment, a transistor for preventing or reducing a short channel effect includes a substrate; a gate stack disposed over the substrate; a first junction region disposed on the substrate at a first side surface of the gate stack and formed of an epitaxial layer; a trench formed within the substrate at a second side surface of the gate stack; and a second junction region disposed below the trench lower than the first junction region.

Preferably, the transistor may further include a first contact plug in contact with the first junction region; and a second contact plug filling the trench and in contact with the second junction region.

Preferably, the substrate includes a trench formed within the substrate at the first side surface of the gate stack, and the first junction region is formed by filling the trench with an epitaxial layer.

Preferably, in a cell region, the first junction region includes a drain region connected to a capacitor.

Preferably, in a peripheral circuit region, the first junction region includes a drain region to which a drain-source voltage Vds is applied.

Preferably, the epitaxial layer is formed of a doped epitaxial layer.

Preferably, the doped epitaxial layer may further include an impurity region into which N-type or P-type impurities are implanted.

Preferably, the gate stack is formed by filling a recess trench, said trench including a first side wall formed within the semiconductor substrate in a vertical direction and a second side wall having a predetermined angle with respect to the surface of the semiconductor substrate and a vertical end, which is in contact with a vertical end of the first side wall.

In another embodiment, a method for manufacturing a transistor for preventing or reducing short channel effect includes forming a gate stack over a substrate; exposing a side surface of the gate stack and a first portion of the substrate; forming a first trench by etching the exposed first portion of the substrate; forming a first junction region by filling the first trench with an epitaxial layer; exposing the other side surface of the gate stack and a second portion of the substrate while blocking the first junction region; forming a second trench which is deeper than the first trench by etching the exposed second portion of the substrate; and forming a second junction region within the substrate below the second trench by performing an ion implantation process on the exposed second trench.

Preferably, the step of forming the gate stack includes forming a recess trench including a first side wall formed within the semiconductor substrate in a vertical direction and a second side wall having a predetermined angle with respect to the surface of the semiconductor substrate and a vertical end, which is in contact with a vertical end of the first side wall; forming the gate stack so as to be aligned with the recess trench; and forming a spacer on the side wall of the gate stack.

Preferably, forming the first junction region includes forming the epitaxial layer by undoped Selective Epitaxial Growth (SEG); implanting N-type conductive impurities onto the epitaxial layer; and forming the first junction region by performing annealing over the epitaxial layer.

Alternatively, forming the first junction region includes forming the epitaxial layer by undoped Selective Epitaxial Growth (SEG); implanting N-type or P-type conductive impurities onto the epitaxial layer; and forming the first junction region by performing annealing over the epitaxial layer.

Alternatively, forming the first junction region includes forming the epitaxial layer by doped Selective Epitaxial Growth (SEG); and forming the first junction region by performing annealing over the epitaxial layer.

DESCRIPTION OF SPECIFIC EMBODIMENTS

Hereinafter, preferred embodiments will be described with reference to the accompanying drawings. However, the embodiments are for illustrative purpose only and are not intended to limit the scope of the invention.

Figure 1:
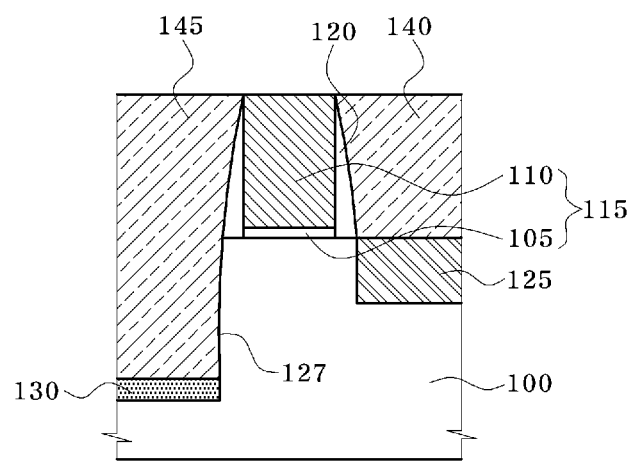
FIG. 1 illustrates a transistor for preventing or reducing short channel effect according to an embodiment of the present invention.

FIG. 1 illustrates a transistor for preventing or reducing short channel effect according to an embodiment of the present invention.

Referring to FIG. 1, in the transistor for preventing or reducing short channel effect according to an embodiment of the present invention, a gate stack 110 and a gate dielectric layer 105 are disposed over a semiconductor substrate 100. The gate stack 110 is preferably formed of, but not limited to, a polysilicon layer, a tungsten layer and a nitride layer sequentially stacked.

Spacers 120 are typically formed at both sides of the gate stack 110 and the gate dielectric layer 105. A first junction region 125, made of an epitaxial layer, is disposed above the semiconductor substrate 100 at a first side surface of the gate stack 110. The first junction region 125 is a drain region connected to a capacitor in a cell region and a drain region, to which a drain-source voltage Vds is applied, in a peripheral circuit region. The epitaxial layer may be formed of a doped epitaxial layer. The doped epitaxial layer may include an impurity region into which N-type or P-type impurities are implanted.

A trench 127 is formed within the semiconductor substrate at a second side surface of the gate stack 110. A second junction region 130 disposed below the trench 127, which is located lower than the first junction region 125, is formed. A first contact plug 140 is formed in contact with the first junction region 125, and a second contact plug 145 is formed to fill the trench 127 and be in contact with the second junction region 130.

The first contact plug 140 connects a capacitor to be formed later and the first junction region 125 in the cell region and allows electrical operation in the second junction region to which the drain-source voltage Vds is applied, in the peripheral circuit region. The transistor for preventing or reducing short channel effect can reduce an increase in the electric field because the first junction region 125 is formed of an epitaxial layer. With reduction in the electric field, the refresh properties can be enhanced in the cell region and the DIBL properties, which have been reduced upon increase in the drain-source voltage, can be improved in the peripheral region. Also, it is possible to reduce contact resistance by employing the epitaxial layer. Further, the channel length is lengthened because the first junction region 125 formed of the epitaxial layer and the second junction region 130 are formed with asymmetric positions. Therefore, it is possible to prevent the short channel effect caused by the reduction in the device size.

A method for manufacturing the transistor for preventing or reducing short channel effect according to an embodiment will be described with reference to the accompanying drawings. FIGS. 2 to 10 illustrate a process of manufacturing the transistor for preventing or reducing short channel effect according to an embodiment.

Figure 2:
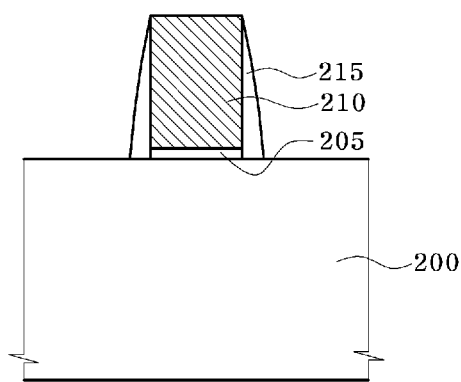
FIGS. 2 to 10 illustrate a process of manufacturing the transistor for preventing or reducing short channel effects according to an embodiment of the present invention.

Referring to FIG. 2, a gate stack 210 and a gate dielectric layer 205 are formed over a semiconductor substrate 200. The gate stack 210 is generally formed of, but not limited to, a sequentially stacked structure comprising a polysilicon layer, a tungsten layer and a nitride layer. A spacer 215 is formed on a first and second side surfaces of the gate stack 210. The spacer 215 is preferably formed of a nitride layer.

Figure 3:
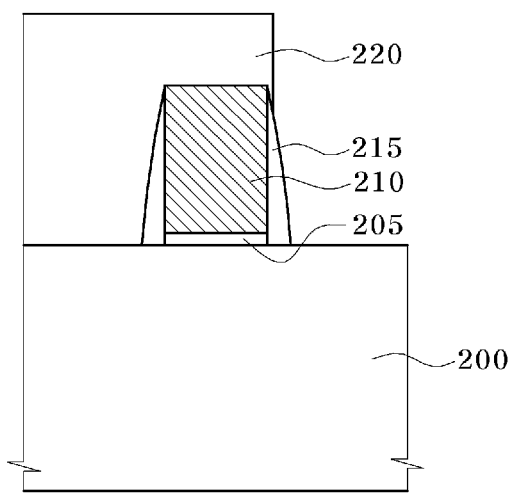

Referring to FIG. 3, a hard mask layer pattern 220 is formed, which exposes a side surface of the gate stack 210 and a first portion of the semiconductor substrate 200. For example, a hard mask layer is deposited over the front surface of the semiconductor substrate 200. The hard mask layer typically includes a nitride layer. A resist is coated over the hard mask layer and a lithography process including exposure and development is performed to form a resist layer pattern (not shown) that exposes some of the hard mask layer. The exposed portion of the hard mask layer is etched using the resist layer pattern as an etching mask to form the hard mask layer pattern 220. The hard mask layer pattern 220 exposes the spacer 215 at a side surface of the gate stack 210 and the first portion of the semiconductor substrate 200, but covers the rest.

Figure 4:
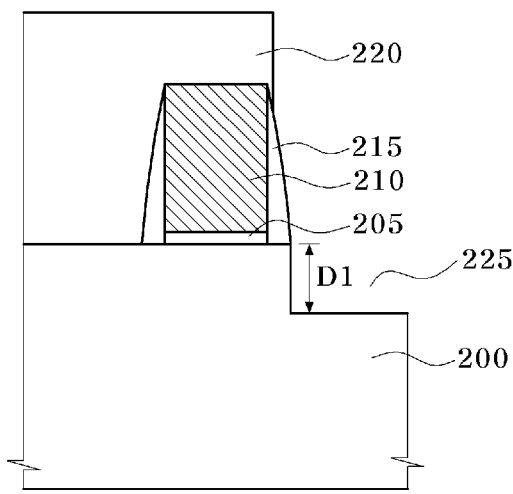

Referring to FIG. 4, the exposed first portion of the semiconductor substrate 200 is etched using the hard mask layer pattern 220 as an etching mask to form a first trench 225 within the semiconductor substrate 200. The first trench 225 is formed by etching the semiconductor substrate 200 by a first depth D1 from the surface of the semiconductor substrate 200.

Figure 5:
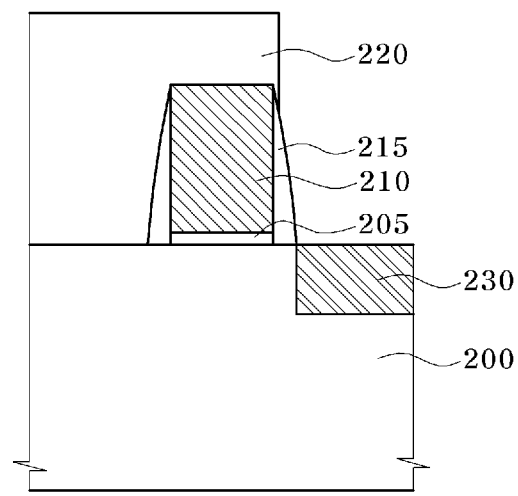

Referring to FIG. 5, the first trench 225 is filled with an epitaxial layer to form a first junction region 230. The first junction region 230 is a drain region in which a capacitor is to be inserted in the cell region and a drain region to which a drain-source voltage Vds is to be applied in the peripheral region. The epitaxial layer may be formed using Selective Epitaxial Growth (SEG). For example, a source gas for the epitaxial growth is supplied onto the semiconductor substrate 200 formed with the first trench 225. The source gas preferably includes a silane (SiH4) gas or a silicon source. A silicon layer is grown from the bottom of the first trench 225 to form the epitaxial layer which fills the first trench 225. The first junction region 230 may be formed in such a manner that an epitaxial layer is formed as a doped SEG layer and an annealing step may then be performed. The annealing may be performed by Rapid Thermal Annealing (RTA). The first junction region 230 may be formed by completely filling the first trench 225 or by partially filling the first trench 225. The first junction region 230 may also be formed in such a manner that an epitaxial layer is formed as an undoped SEG layer, impurities are implanted, and annealing is then performed. This will be further described in FIG. 10.

The other side surface of the gate stack 210 blocked by the hard mask layer pattern 220 is not affected by the SEG. Therefore, it is possible to form the first junction region 230 by selectively filling the first trench 225 alone with the epitaxial layer. As a result, it is possible to decrease the intensity of the electric field generated in the drain region because the first junction region 230, formed of an epitaxial layer, is disposed above the semiconductor substrate at a side surface of the gate stack 210. Also, it is possible to form the more uniform intensity of the electric field in the first junction region 230 than that in the junction region formed by the implantation process. After that, the hard mask layer pattern 220 is removed by a strip process.

Figure 6:
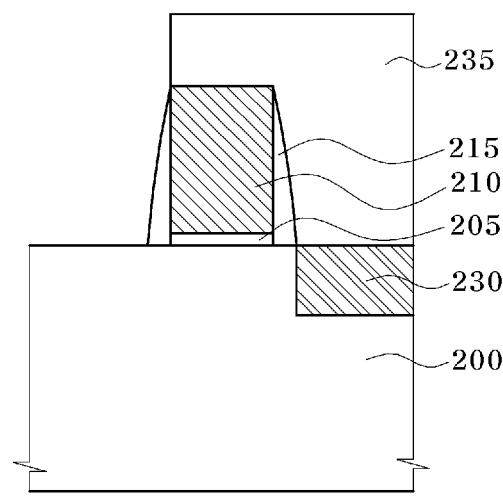

Referring to FIG. 6, a resist layer pattern 235 is formed which covers the first junction region 230 but exposes a second portion of the semiconductor substrate 200. For example, a resist layer is formed over a surface of the semiconductor substrate 200. A lithography process including exposure and development is performed on the resist layer to form the resist layer pattern 235. The resist layer pattern 235 exposes the spacer 215 on the other side surface of the gate stack 210 and the second portion of the semiconductor substrate 200, but covers the first junction region 230.

Figure 7:
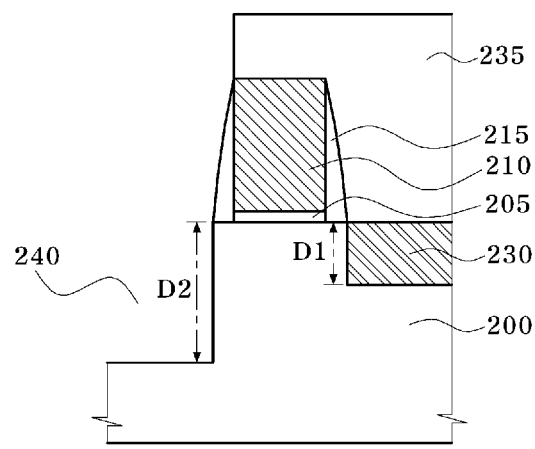

Referring to FIG. 7, the exposed second portion of the semiconductor substrate 200 is etched using the resist layer pattern 235 as an etching mask to form a second trench 240. The second trench 240 is formed by etching the semiconductor substrate 200 by a second depth D2 from the surface of the semiconductor substrate 200. Preferably, the second depth D2 of the second trench 240 is greater than the first depth D1 of the first trench 225.

Figure 8:
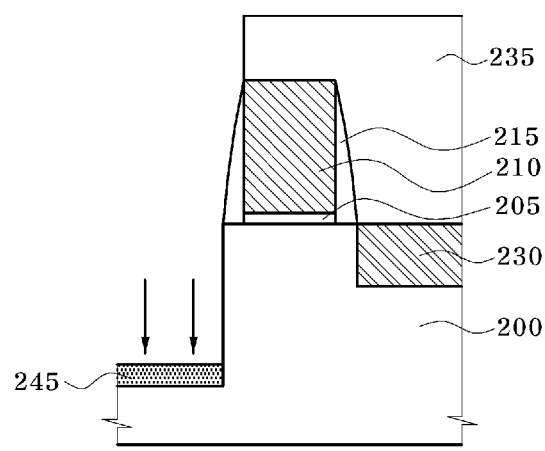

Referring to FIG. 8, as indicated by arrows, impurities are implanted into the second trench 240 using the resist layer pattern 235 as an ion implantation barrier. The implanted impurities are diffused and a second junction region 245 is formed within the semiconductor substrate 200 below the second trench 240. The second junction region may be disposed higher than the first junction region 230 when the electric field is not large.

Figure 9:
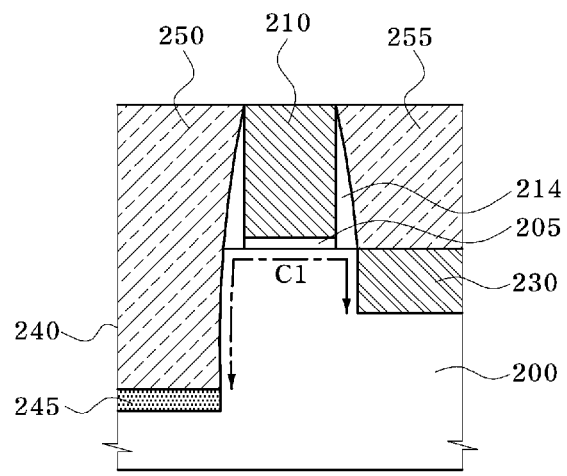

Referring to FIG. 9, a first contact plug 250 which fills the second trench 240 and a second contact plug 255 in contact with the first junction region are formed. For example, a conductive layer is deposited over the semiconductor substrate 200. The conductive layer may be formed of a polysilicon layer to a thickness capable of fully filling the second trench 240. A planarization process can be performed on the semiconductor substrate 200 to separate the conductive layer. The planarization may be performed by Chemical Mechanical Polishing (CMP). Then, the first contact plug 250 which fills the second trench 240 and the second contact plug 255 in contact with the first junction region are formed over the semiconductor substrate 200. The first contact plug 250 and the second contact plug 244 may be formed to a height equal to the upper end of the gate stack 210.

Therefore, a transistor is formed, which includes the first junction region 230, which is formed of an epitaxial layer and disposed above the semiconductor substrate 200 at a first side surface of the gate stack 210 and a second junction region 245 formed below the trench formed within the semiconductor substrate 200 at a second side surface of the gate stack 210 over the semiconductor substrate 200. In this transistor, a channel C1 is formed between the first junction region 230 and the second junction region 245. Accordingly, the channel length C1 of the transistor according to an embodiment is increased because the first junction region 230 and the second junction region 245 are formed with asymmetric positions as compared to a conventional transistor having a channel length equal to the line width of the gate stack. Therefore, it is possible to prevent short channel effect caused by reduction in the device size. Also, it is possible to reduce the electric field because the epitaxial layer is formed by SEG in the first junction region 230. With reduction in the electric field, the refresh properties can be enhanced in the cell region, and the DIBL properties, which have been weak upon increase in the drain-source voltage, can be improved in the peripheral circuit region. Also, it is possible to reduce contact resistance by employing the epitaxial layer.

Figure 10:
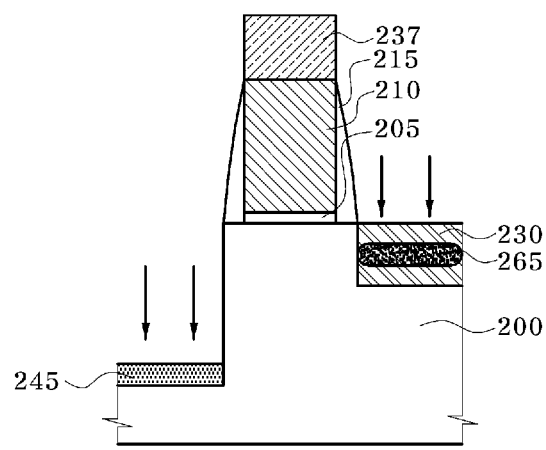

Alternatively, the first junction region 230 may be formed in such a manner that an epitaxial layer is formed as an undoped SEG layer, impurities are implanted, and annealing is then performed. Referring to FIG. 10, a resist layer pattern 237 is formed which covers some of the gate stack 210. The resist layer pattern 237 covers only the gate stack 210 and exposes the first junction region 230 and the second trench 240. Next, conductive impurities are implanted into the exposed first junction region 230 and the semiconductor 200 corresponding to the second trench 240 using the resist layer pattern 237 as an ion implantation barrier layer. N-type conductive impurities are implanted in the cell region and N-type or P-type conductive impurities are implanted in the peripheral circuit region. By performing annealing, the implanted impurities are diffused and a second junction region 245 is formed within the semiconductor substrate 200 below the second trench 240. Also, an impurity region 265 is formed within the first junction region 230. In this case, even though the epitaxial layer is formed as an undoped SEG layer and the ion implantation process is subsequently performed thereon, the same effect as the ion implantation into the silicon bulk can be obtained with implantation of small amount of impurities because of the unique mobility of the epitaxial layer.

Figure 11:
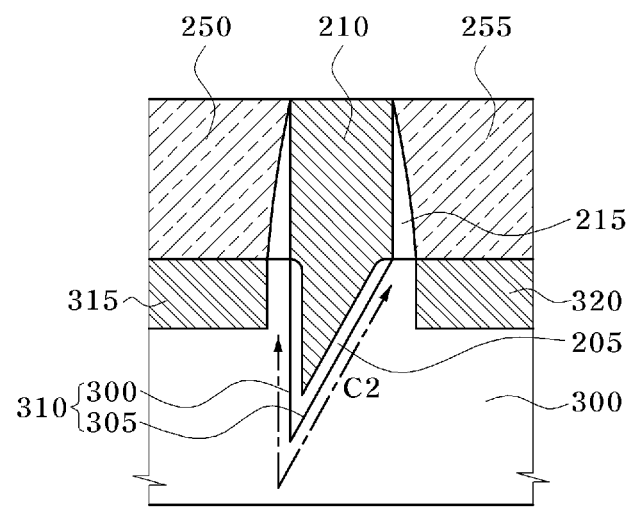
FIGS. 11 and 12 illustrate a gate stack structure according to another embodiment of the present invention.
Figure 12:
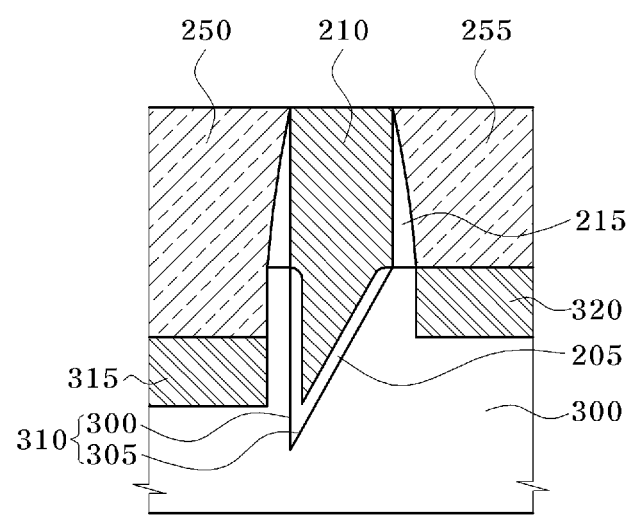

In addition, it is possible to further increase the channel length by modifying the structure of the gate stack 210. FIGS. 11 and 12 illustrate a gate stack structure according to another embodiment of the present invention.

Referring to FIGS. 11 and 12, the gate stack 210 may be formed to fill the recess trench 310 including a first side wall 300 formed within the semiconductor substrate 200 in a vertical direction (90° relative to the substrate surface) and a second side wall 305 having a predetermined angle relative to the surface of the semiconductor substrate 200 and a vertical end, which is in contact with a vertical end of the first side wall 300. Also, a first junction region 315 formed of an epitaxial layer and a second junction region 320 are disposed above the semiconductor substrate 200 at both side surfaces of the gate stack 210. The first junction region 315 and the second junction region 320 may be disposed at the same level over the semiconductor substrate 200 (refer to FIG. 11), or the first junction region 315 and the second junction region 320 may be disposed in different vertical positions (refer to FIG. 12).

Therefore, the channel C2 is formed along the lower portion of the first side wall 300 and the second side wall 305. The transistor with this structure can prevent or reduce the short channel effect because its channel length is longer than conventional flat transistors. Also, even though the gate length is the same, the channel length can be adjusted by varying the lengths of the first side wall 300 and the second side wall 305. Also, by adjusting the length of the second side wall 305, it is possible to control the threshold voltage without changing the gate length.

While the present invention has been described with respect to the specific embodiments, it will be apparent to those skilled in the art that various changes and modifications may be made without departing from the spirit and scope of the invention as defined in the following claims.

What is claimed is:
1. A method for manufacturing a transistor for preventing or reducing short channel effect, comprising:
   forming a gate stack over a substrate;
   exposing a side surface of the gate stack and a first portion of the substrate;

forming a first trench by etching the exposed first portion of the substrate;

forming a first junction region by filling the first trench with an epitaxial layer;

exposing the other side surface of the gate stack and a second portion of the substrate while blocking the first junction region;

forming a second trench which is deeper than the first trench by etching the exposed second portion of the substrate; and forming a second junction region within the substrate below the second trench by performing an ion implantation process on the exposed second trench.

2. The method of claim 1, wherein forming the gate stack comprises:

forming a recess trench including a first side wall formed within the semiconductor substrate in a vertical direction and a second side wall having a predetermined angle with respect to the surface of the semiconductor substrate;

forming the gate stack so as to be aligned with the recess trench; and forming a spacer on the side wall of the gate stack.

3. The method of claim 1, comprising forming the epitaxial layer by Selective Epitaxial Growth (SEG).

4. The method of claim 1, wherein in a cell region, the first junction region comprises a drain region to be connected to a capacitor.

5. The method of claim 1, wherein in a peripheral circuit region, the first junction region comprises a drain region to which a drain-source voltage Vds is to be applied.

6. The method of claim 1, wherein forming the first junction region comprises:

forming the epitaxial layer as an undoped Selective Epitaxial Growth (SEG) layer;

implanting N-type conductive impurities into the epitaxial layer; and annealing the epitaxial layer thereby forming the first junction region.

7. The method of claim 1, wherein forming the first junction region comprises:

forming the epitaxial layer as an undoped Selective Epitaxial Growth (SEG) layer;

implanting N-type or P-type conductive impurities into the epitaxial layer; and annealing the epitaxial layer thereby forming the first junction region.

8. The method of claim 1, wherein forming the first junction region comprises:

forming the epitaxial layer as an doped Selective Epitaxial Growth (SEG) layer; and annealing the epitaxial layer thereby forming the first junction region.

* * * * *